US012750048B2

(12) United States Patent
Masuda et al.

(10) Patent No.: US 12,750,048 B2
(45) Date of Patent: Sep. 29, 2026

(54) SIGNAL TRANSMITTING APPARATUS

(71) Applicant: ROHM CO., LTD., Kyoto (JP)

(72) Inventors: Shinya Masuda, Kyoto (JP); Masaki Itasaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 16 days.

(21) Appl. No.: 19/063,813

(22) Filed: Feb. 26, 2025

(65) Prior Publication Data

US 2025/0219634 A1 Jul. 3, 2025

Related U.S. Application Data

(63) Continuation of application No. PCT/JP2023/023588, filed on Jun. 26, 2023.

(30) Foreign Application Priority Data

Sep. 8, 2022 (JP) ................................ 2022-143090

(51) Int. Cl.
*H03K 17/16* (2006.01)

(52) U.S. Cl.
CPC ................................ *H03K 17/162* (2013.01)

(58) Field of Classification Search
None
See application file for complete search history.

(56) References Cited

U.S. PATENT DOCUMENTS

| | | | | |
|---|---|---|---|---|
| 9,928,194 | B2 * | 3/2018 | Ross | G06F 13/404 |
| 11,841,810 | B2 * | 12/2023 | Banerjee | G06F 13/20 |
| 2003/0122594 | A1 * | 7/2003 | Tada | H03K 17/687 327/108 |
| 2015/0008732 | A1 * | 1/2015 | Fujimoto | H03K 19/003 327/109 |

FOREIGN PATENT DOCUMENTS

| | | |
|---|---|---|
| JP | 2017200103 A | 11/2017 |

OTHER PUBLICATIONS

International Search Report for International Application No. PCT/JP2023/023588; mailed Aug. 22, 2023.
PCT Written Opinion of the International Searching Authority for International Application No. PCT/JP2023/023588; mailed Aug. 22, 2023.

* cited by examiner

*Primary Examiner* — Cassandra F Cox
(74) *Attorney, Agent, or Firm* — CANTOR COLBURN LLP

(57) ABSTRACT

An output terminal is connected to an application terminal of a power supply voltage via a pull-up resister and a back-current prevention diode. An output transistor is disposed between the output terminal and a ground. A capacitor is connected between the gate of the output transistor and the output terminal. A charge-discharge circuit charges or discharges the gate of the output transistor in accordance with an input signal, and thus turns on or off the output transistor, so as to generate an output signal corresponding to the input signal, at the output terminal. The charge-discharge circuit set a charge current and a discharge current of the gate of the output transistor as an adjustment target current, and changes the adjustment target current nonlinearly in accordance with the power supply voltage.

6 Claims, 6 Drawing Sheets

[WHEN VDD = $VDD_{MAX}$ HOLDS]

SIGNAL TRANSMITTING APPARATUS

CROSS-REFERENCE TO RELATED APPLICATIONS

This application is a continuation under 35 U.S.C. § 120 of International Patent Application No. PCT/JP2023/023588 filed on Jun. 26, 2023, which is incorporated herein by reference, and which claimed priority to Japanese Patent Application No. 2022-143090 filed on Sep. 8, 2022. The present application likewise claims priority under 35 U.S.C. § 119 to Japanese Patent Application No. 2022-143090 filed on Sep. 8, 2022, the entire contents of which is also incorporated herein by reference.

TECHNICAL FIELD

The present disclosure relates to a signal transmitting apparatus.

BACKGROUND ART

There is a signal transmitting apparatus that transmits an output signal from an output terminal. One type of the signal transmitting apparatus needs to satisfy both a required performance related to an output signal slew rate and a required performance related to radiation noise.

LIST OF CITATIONS

Patent Literature

Patent Document 1: JP-A-2017-200103

DESCRIPTION OF EMBODIMENTS

Figure 1:
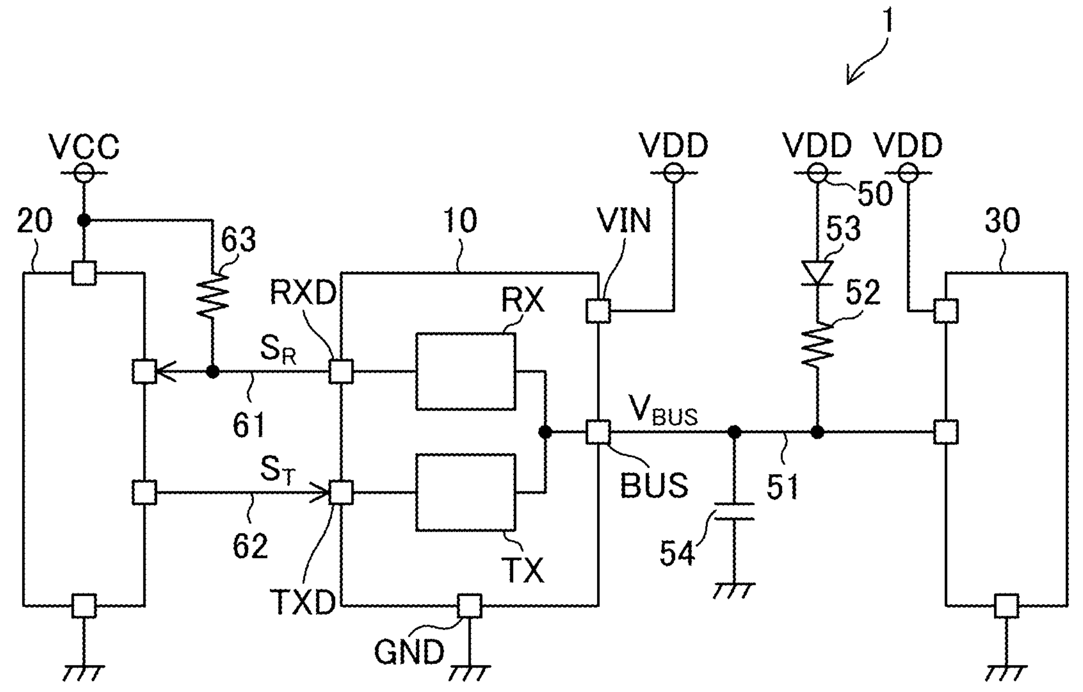
FIG. 1 is an overall structural diagram of a communication system according to an embodiment of the present disclosure.

Hereinafter, an example of an embodiment of the present disclosure is specifically described with reference to the drawings. In the drawings that are referred to, the same part is denoted by the same numeral or symbol, and overlapping description of the same part is omitted as a rule. Note that in this specification, for simple description, a name of information, a signal, a physical quantity, a functional unit, a circuit, an element, a component, or the like may be omitted or abbreviated by referring to a numeral or symbol representing the same. For instance, a bus connection terminal BUS represented by "BUS" described later (see FIG. 1) may be written as a "bus connection terminal BUS" or simply as a "terminal BUS", which both indicate the same matter.

First, some terms used for describing the embodiment of the present disclosure are described below. A line means a wiring through which an electric signal is transmitted or to which the same is applied. A ground means a reference conductive part having a potential of zero volts (0 V) to be a reference, or it means the potential of 0 V itself. The reference conductive part may be formed using a conductor such as metal. The potential of 0 V may be referred to as a ground potential. In the embodiment of the present disclosure, a voltage without a specific reference means a potential with respect to the ground.

A level means a potential level, and for an arbitrary noted signal or voltage, a high level has a higher potential than a low level. For an arbitrary noted signal or voltage, if the signal or voltage is at high level, it means that the level of the signal or voltage is at high level in a precise sense, and if the signal or voltage is at low level, it means that the level of the signal or voltage is at low level in a precise sense. A level of a signal may be referred to as a signal level, and a level of a voltage may be referred to as a voltage level.

For an arbitrary noted signal or voltage, switching from low level to high level is referred to as an up edge. The up edge may be read as a rising edge. Similarly, in an arbitrary noted signal or voltage, switching from high level to low level is referred to as a down edge. The down edge may be read as a falling edge.

For an arbitrary transistor constituted as a field effect transistor (FET) including a MOSFET, ON state means a conducting state between drain and source of the transistor, while OFF state means a non-conducting state (cut-off state) between drain and source of the transistor. The same is true also for a transistor that is not classified into FET. A MOSFET is understood as an enhancement-type MOSFET unless otherwise noted. MOSFET is an abbreviation of "metal-oxide semiconductor field effect transistor". In addition, for an arbitrary MOSFET, it may be considered that the backgate is connected to the source unless otherwise noted.

For an arbitrary signal having a signal level of high level or low level, the period while the signal level is high level is referred to as a high level period, while the period while the signal level is low level is referred to as a low level period. The same is true for an arbitrary voltage having a voltage level of high level or low level.

A connection between a plurality of parts constituting a circuit, such as arbitrary circuit elements, wirings (lines), or nodes, should be understood to mean an electrical connection unless otherwise noted.

FIG. 1 illustrates an overall structural diagram of a communication system 1 according to the embodiment of the present disclosure. The communication system 1 includes a transceiver 10, a microcomputer 20, and other side device 30. A bus line 51, a pull-up resister 52, a backcurrent prevention diode 53, a capacitor 54, a data line 61, a data line 62, and a pull-up resister 63 are also included in components of the communication system 1.

Figure 2:
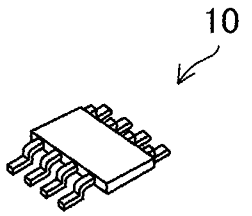
FIG. 2 is an external perspective view of a transceiver according to the embodiment of the present disclosure.

FIG. 2 is an external perspective view of the transceiver 10. The transceiver 10 is an electronic component including a semiconductor chip having a semiconductor integrated circuit formed on a semiconductor substrate, a case (package) housing the semiconductor chip, and a plurality of external terminals exposed from the case to outside of the transceiver 10. By enclosing the semiconductor chip in the case (package) made of resin, the transceiver 10 is formed. Note that the number of the external terminals of the transceiver 10 and a type of the case of the transceiver 10 illustrated in FIG. 2 are merely examples, which can be arbitrarily designed. FIG. 1 illustrates a power supply terminal VIN, the bus connection terminal BUS, a ground terminal GND, a reception data output terminal RXD, and a transmission data input terminal TXD, which are included in the plurality of external terminals described above. Other external terminals (such as a sleep control input terminal) can also be provided to the transceiver 10.

A power supply voltage VDD is supplied to the power supply terminal VIN from a voltage source that is not illustrated. The power supply voltage VDD has a predetermined positive DC voltage value. The transceiver 10 is driven on the basis of the power supply voltage VDD. The ground terminal GND is connected to the ground. The bus connection terminal BUS is connected to one end of the bus line 51, and the other end of the bus line 51 is connected to the other side device 30. In other words, the bus connection terminal BUS is connected to the other side device 30 via the bus line 51. Note that the other side device 30 also has a terminal for receiving the power supply voltage VDD and a terminal that is connected the ground and is driven on the basis of the power supply voltage VDD.

The bus line 51 is connected to an application terminal 50 of the power supply voltage VDD via the pull-up resister 52 and the backcurrent prevention diode 53. The application terminal 50 is a terminal to which the power supply voltage VDD is applied. The backcurrent prevention diode 53 has a forward direction from the application terminal 50 to the bus line 51 and the bus connection terminal BUS. The backcurrent prevention diode 53 blocks current flow from the bus line 51 to the application terminal 50. More specifically, the anode of the backcurrent prevention diode 53 is connected to the application terminal 50 while the cathode of the backcurrent prevention diode 53 is connected to one end of the pull-up resister 52, and the other end of the pull-up resister 52 is connected to the bus line 51.

However, disposed positions of the pull-up resister 52 and the backcurrent prevention diode 53 may be opposite to those illustrated in FIG. 1. In other words, it may be possible that the application terminal 50 is connected to the anode of the backcurrent prevention diode 53 via the pull-up resister 52, and that the cathode of the backcurrent prevention diode 53 is connected to the bus line 51.

The capacitor 54 is connected between the bus line 51 and the ground. In other words, one end of the capacitor 54 is connected to the bus line 51, and the other end of the capacitor 54 is connected to the ground. Note that the capacitor 54 may be constituted of a plurality of capacitors that are separated from each other. The capacitor 54 may be omitted.

The reception data output terminal RXD is connected to one end of the data line 61, and the other end of the data line 61 is connected to the microcomputer 20. The transmission data input terminal TXD is connected to one end of the data line 62, and the other end of the data line 62 is connected to the microcomputer 20. In other words, the terminals RXD and TXD are connected to the microcomputer 20 via the data lines 61 and 62. The data line 61 is connected to an application terminal of a power supply voltage VCC via the pull-up resister 63. The power supply voltage VCC has a predetermined positive DC voltage value. It does not matter whether or not the power supply voltages VCC and VDD have the same value. The microcomputer 20 has a terminal for receiving the power supply voltage VCC and a terminal connected to the ground and is driven on the basis of the power supply voltage VCC.

The transceiver 10 includes a receiving circuit RX and a transmitting circuit TX. The receiving circuit RX is connected to the reception data output terminal RXD and the bus connection terminal BUS. The transmitting circuit TX is connected to the transmission data input terminal TXD and the bus connection terminal BUS.

The transceiver 10 and the other side device 30 perform bidirectional communication with each other by a half-duplex system via the bus line 51. The bidirectional communication supposed in this embodiment is a serial communication by a single wire protocol (i.e., a serial communication using the bus line 51 as a single wire). In the bidirectional communication by the half-duplex system, it may be possible that the transceiver 10 works as a master while the other side device 30 works as a slave, or it may be possible that the other side device 30 works as a master while the transceiver 10 works as a slave. The bidirectional communication between the transceiver 10 and the other side device 30 may be, for example, bidirectional communication conforming the LIN (Local Interconnect Network) standard or the CXPI (Clock Extension Peripheral Interface) standard.

In the bidirectional communication by the half-duplex system, either one of the transceiver 10 and the other side device 30 works as a transmission side device, and the other works as a reception side device.

When the transceiver 10 works as a reception side device, the other side device 30 transmits a signal (hereinafter, referred to as a signal $S_R$) via the bus line 51, and the receiving circuit RX receives the signal $S_R$ transmitted from the other side device 30, at the bus connection terminal BUS. The receiving circuit RX transfers the received signal $S_R$ from terminal RXD to the microcomputer 20 via the data line 61. When the transceiver 10 works as a reception side device, the bus connection terminal BUS works as an input terminal (a signal reception terminal) that receives the signal transmitted from the other side device 30.

When the transceiver 10 works as a transmission side device, the microcomputer 20 transmits a signal (hereinafter, referred to as a signal $S_T$) to the transceiver 10 via the data line 62. The signal $S_T$ from the microcomputer 20 is received at the terminal TXD. When the transceiver 10 works as a transmission side device, the transmitting circuit TX transmits the signal $S_T$ received from the microcomputer 20 to the other side device 30 via the bus line 51. The other side device 30 may be constituted of a transceiver and a microcomputer, which are similar to the transceiver 10 and the microcomputer 20, and in this case the signal $S_T$ received from the transceiver 10 is transferred from the transceiver of the other side device 30 to the microcomputer of the other side device 30. When the transceiver 10 works as a transmission side device, the bus connection terminal BUS works as an output terminal (a signal transmission terminal) at which the signal appears to be transmitted from the transceiver 10.

The signal transmission via the bus line 51 is realized by controlling the level of the bus line 51 to be high level or low level. The level of the bus line 51 is the same as the level of the bus connection terminal BUS. The level of the bus line 51 is 0 V or more and less than or equal to the level of the power supply voltage VDD. When the bus line 51 has a level of voltage ($VDD \times k_H$) or more, the level of the bus line 51 corresponds to high level. When the bus line 51 has a level of voltage ($VDD \times k_L$) or less, the level of the bus line 51 corresponds to low level. Here "$1>k_H>0.5>k_L>0$" holds, and ($k_H$, $k_L$)=(0.7, 0.3) holds, for example. The voltage of the bus line 51 and the bus connection terminal BUS is represented by a symbol "$V_{BUS}$".

Hereinafter, an operation and a structure where the transceiver 10 works as a transmission side device is described unless otherwise noted. For the transmitting circuit TX, the voltage $V_{BUS}$ corresponds to an output voltage (an output voltage of the transmitting circuit TX). Therefore, the voltage $V_{BUS}$ when a structure or an operation of the transmitting circuit TX is noted can be referred to as the output voltage in the following description. The signal indicated by the output voltage $V_{BUS}$ can be referred to as an output signal. The transmitting circuit TX of the transceiver 10 has a function of controlling a slew rate of the output voltage $V_{BUS}$ in order to reduce radiation noise, when changing the level of the bus line 51 between high level and low level, in signal transmission via the bus line 51.

[Basic Structure of Transmitting Circuit TX]

Figure 3:
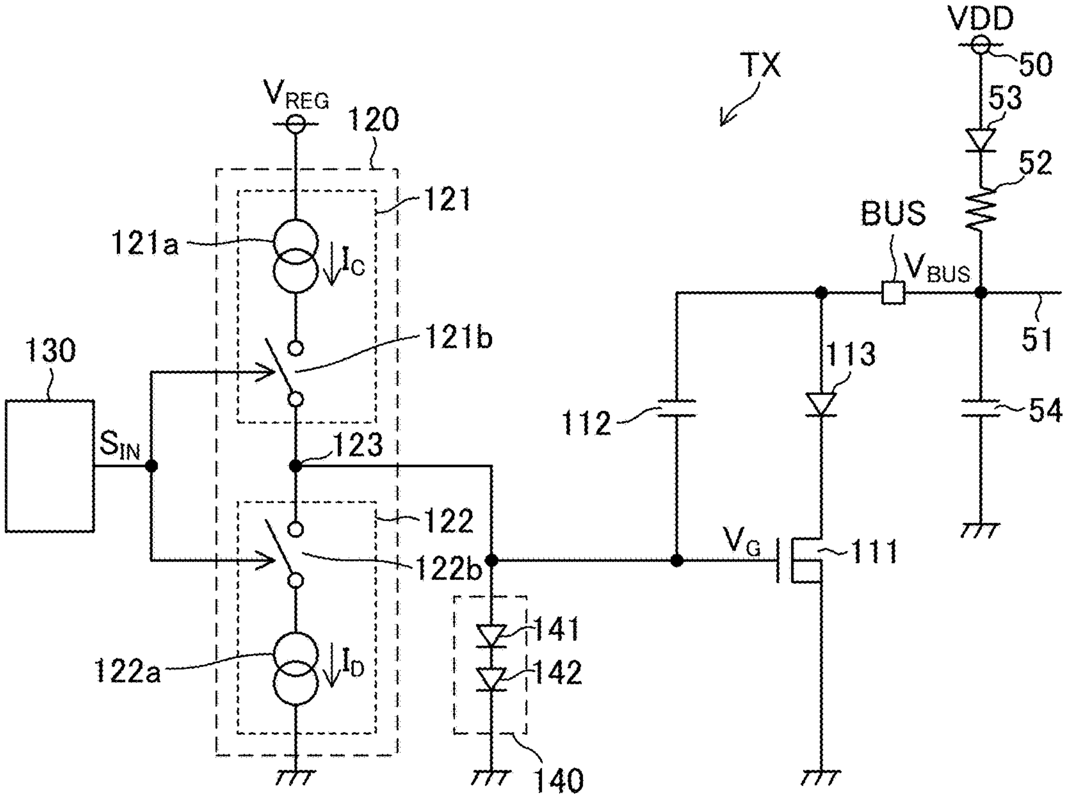
FIG. 3 is a structural diagram of a transmitting circuit in the transceiver according to the embodiment of the present disclosure.

FIG. 3 illustrates a basic structure of the transmitting circuit TX. The transmitting circuit TX according to the basic structure includes an output transistor 111, a capacitor (a feedback capacitor) 112, a backcurrent prevention diode 113, a charge-discharge circuit 120, a control input signal supply circuit 130, and a gate voltage limit circuit 140.

The output transistor 111 is an N-channel type MOSFET. The output transistor 111 is disposed between the bus connection terminal BUS that works as an output terminal and the ground, and the transmitting circuit TX performs signal transmission by using the output transistor 111 having an open drain structure. However, the backcurrent prevention diode 113 is disposed between the output transistor 111 and the bus connection terminal BUS, in order to block current flow from the ground to the bus line 51 via the output transistor 111 and the bus connection terminal BUS. Specifically, the drain of the output transistor 111 is connected to the cathode of the backcurrent prevention diode 113, and the anode of the backcurrent prevention diode 113 is connected to the bus connection terminal BUS. The source of the output transistor 111 is connected to the ground. A gate voltage of the output transistor 111 (i.e., a voltage applied to the gate of the output transistor 111) is represented by a symbol "$V_G$". A gate threshold voltage of the output transistor 111 is represented by a symbol "$V_{G\_TH}$". The gate threshold voltage $V_{G\_TH}$ has a positive voltage value depending on characteristics of the output transistor 111. When the gate voltage $V_G$ of the output transistor 111 is less than the gate threshold voltage $V_{G\_TH}$, the output transistor 111 is in OFF state. When the gate voltage $V_G$ of the output transistor 111 is the gate threshold voltage $V_{G\_TH}$ or more, the output transistor 111 is in ON state.

Note that the transmitting circuit TX may be modified so that the backcurrent prevention diode 113 is not disposed, and when this modification is adopted, the drain of the output transistor 111 is directly connected to the bus connection terminal BUS.

The capacitor 112 is connected between the gate of the output transistor 111 and the bus connection terminal BUS. In other words, one end of the capacitor 112 is connected to the gate of the output transistor 111, and the other end of the capacitor 112 is connected to the bus connection terminal BUS.

The charge-discharge circuit 120 charges or discharges the gate of the output transistor 111 in accordance with a control input signal $S_{IN}$. The charge-discharge circuit 120 can control the output transistor 111 to be ON state by charging the gate of the output transistor 111 and can control the output transistor 111 to be OFF state by discharging the gate of the output transistor 111. The control input signal $S_{IN}$ is a binary signal having a signal level of high level or low level. The control input signal $S_{IN}$ of high level has substantially a potential of an internal power supply voltage $V_{REG}$, and the control input signal $S_{IN}$ of low level has substantially the ground potential. The internal power supply voltage $V_{REG}$ that is a positive DC voltage is generated from the power supply voltage VDD by a regulator (not shown) in the transceiver 10. The charge-discharge circuit 120 includes a charging circuit 121 and a discharging circuit 122.

During the high level period of the control input signal $S_{IN}$, the charging circuit 121 supplies a charge current to the gate of the output transistor 111, so as to increase the gate voltage $V_G$ of the output transistor 111. However, the gate voltage $V_G$ has an upper limit, and the gate voltage $V_G$ does not increase over the upper limit voltage. The upper limit voltage of the gate voltage $V_G$ is the internal power supply voltage $V_{REG}$ or is a predetermined voltage lower than the internal power supply voltage $V_{REG}$. The upper limit voltage of the gate voltage $V_G$ is higher than the gate threshold voltage $V_{G\_TH}$ of the output transistor 111. During the period while the gate voltage $V_G$ increases from a sufficiently low voltage (e.g., 0 V), when the gate voltage $V_G$ reaches the gate threshold voltage $V_{G\_TH}$, the output transistor 111 switches from OFF state to ON state. Specifically, during the period while the gate voltage $V_G$ increases from a sufficiently low voltage (e.g., 0 V), when the gate voltage $V_G$ becomes the gate threshold voltage $V_{G\_TH}$ or higher, a channel resistance value of the output transistor 111 is rapidly decreased, and when the channel resistance value of the output transistor 111 becomes sufficiently smaller than the resistance value of the pull-up resister 52, the voltage $V_{BUS}$ is decreased to substantially 0 V. The channel resistance value of the output transistor 111 means a resistance value between drain and source of the output transistor 111.

During the low level period of the control input signal $S_{IN}$, the discharging circuit 122 draws a discharge current from the gate of the output transistor 111, so as to decrease the gate voltage $V_G$ of the output transistor 111. However, the gate voltage $V_G$ has a lower limit, and the gate voltage $V_G$ does not decrease under the lower limit voltage. The lower limit voltage of the gate voltage $V_G$ is 0 V. During the period while the gate voltage $V_G$ decreases from a voltage higher than the gate threshold voltage $V_{G\_TH}$, when the gate voltage $V_G$ becomes below the gate threshold voltage $V_{G\_TH}$, the output transistor 111 switches from ON state to OFF state. Specifically, during the period while the gate voltage $V_G$ decreases from a voltage higher than the gate threshold voltage $V_{G\_TH}$, when the gate voltage $V_G$ becomes lower than the gate threshold voltage $V_{G\_TH}$, the channel resistance value of the output transistor 111 is rapidly increased, and when the channel resistance value of the output transistor 111 becomes sufficiently larger than the resistance value of the pull-up resister 52, the output voltage $V_{BUS}$ increases to near the power supply voltage VDD.

In the structural example of FIG. 3, the charging circuit 121 is constituted of a series circuit of a charging current source 121*a* and a switch 121*b*, and the discharging circuit 122 is constituted of a series circuit of a discharging current source 122*a* and a switch 122*b*. The charging current source 121*a* is disposed between an application terminal of the internal power supply voltage $V_{REG}$ and the switch 121*b*, so as to generate a current $I_C$ on the basis of the internal power supply voltage $V_{REG}$. The switch 121*b* is disposed between the charging current source 121*a* and a node 123. The discharging current source 122*a* is disposed between the ground and the switch 122*b*, so as to generate a current $I_D$ on the basis of the internal power supply voltage $V_{REG}$. The switch 122*b* is disposed between the discharging current source 122*a* and the node 123. The node 123 is connected to the gate of the output transistor 111. The switches 121*b* and 122*b* are controlled to be on or off on the basis of the control input signal $S_{IN}$.

During the high level period of the control input signal $S_{IN}$, the switch 121*b* is turned on while the switch 122*b* is turned off. Therefore, during the high level period of the control input signal $S_{IN}$, the current $I_C$ for increasing the gate voltage $V_G$ (hereinafter, referred to as a charge current $I_C$) is supplied from the charging current source 121*a* to the gate of the output transistor 111 via the switch 121*b* and the node 123. During the low level period of the control input signal $S_{IN}$, there is no charge exchange between the gate of the output transistor 111 and the charging circuit 121.

During the low level period of the control input signal $S_{IN}$, the switch 121*b* is turned off while the switch 122*b* is turned on. Therefore, during the low level period of the control input signal $S_{IN}$, the current $I_D$ for decreasing the gate voltage $V_G$ (hereinafter, referred to as a discharge current $I_D$) is drawn from the gate of the output transistor 111 to the discharging current source 122*a* via the node 123 and the switch 122*b*. During the high level period of the control input signal $S_{IN}$, there is no charge exchange between the gate of the output transistor 111 and the discharging circuit 122.

The control input signal supply circuit 130 generates the control input signal $S_{IN}$ on the basis of the signal $S_T$ received from the microcomputer 20 and supplies the control input signal $S_{IN}$ to the charge-discharge circuit 120. The control input signal supply circuit 130 may generate, for example, a binary signal obtained by shaping a waveform of the signal $S_T$, as the control input signal $S_{IN}$.

Note that the charging circuit 121 may have any structure, as long as it can supply the charge current $I_C$ to the gate of the output transistor 111 during the high level period of the control input signal $S_{IN}$. During the low level period of the control input signal $S_{IN}$, the charging circuit 121 may stop generation of the charge current $I_C$. In any case, during the low level period of the control input signal $S_{IN}$, the charge current $I_C$ from the charging circuit 121 to the gate of the output transistor 111 is zero. Similarly, the discharging circuit 122 may have any structure, as long as it can draw the discharge current $I_D$ from the gate of the output transistor 111 during the low level period of the control input signal $S_{IN}$. During the high level period of the control input signal $S_{IN}$, the discharging circuit 122 may stop generation of the discharge current $I_D$. In any case, during the high level period of the control input signal $S_{IN}$, the discharge current $I_D$ from the gate of the output transistor 111 to the discharging circuit 122 is zero.

The gate voltage limit circuit 140 is connected to the gate of the output transistor 111 and the ground. The gate voltage limit circuit 140 has two diodes 141 and 142. The anode of the diode 141 is connected to the gate of the output transistor 111 while the cathode of the diode 141 is connected to the anode of the diode 142, and the cathode of the diode 142 is connected to the ground. The gate voltage limit circuit 140 has a function of suppressing the gate voltage $V_G$ from being a predetermined limit voltage $V_{LIM}$ or more and may be any circuit as long as it has the function. Here, the limit voltage $V_{LIM}$ is higher than the gate threshold voltage $V_{G\_TH}$ and corresponds to the sum of forward voltages of the diodes 141 and 142 in the structural example of FIG. 3. It may be possible that the circuit 140 is constituted of a series circuit of three or more diodes.

During the period while the output transistor 111 switches from OFF state to ON state due to an increase in the gate voltage $V_G$ based on the charge current $I_C$, the output voltage $V_{BUS}$ is decreased, and the decrease in the output voltage $V_{BUS}$ is fed back to the gate of the output transistor 111 via the capacitor 112. On the contrary, during the period while the output transistor 111 switches from ON state to OFF state due to a decrease in the gate voltage $V_G$ based on the discharge current $I_D$, the output voltage $V_{BUS}$ is increased, and the increase in the output voltage $V_{BUS}$ is fed back to the gate of the output transistor 111 via the capacitor 112. For this reason, with respect to the charge-discharge circuit 120, a capacitance value of the capacitor 112 looks larger than the actual capacitance value of the capacitor 112 in an equivalent manner, due to a mirror effect. In other words, the capacitor 112 functions as a mirror capacitor.

[Output Signal Conditions]

As the slew rate of the output voltage $V_{BUS}$, there are an up slew rate when the output voltage $V_{BUS}$ is increased, and a down slew rate when the output voltage $V_{BUS}$ is decreased. The up slew rate indicates a maximum value or an average value of change rates of the output voltage $V_{BUS}$ when the output voltage $V_{BUS}$ is increased. The down slew rate indicates a maximum value or an average value of change rates of the output voltage $V_{BUS}$ when the output voltage $V_{BUS}$ is decreased. Hereinafter, the up slew rate and the down slew rate are collectively referred to as output slew rates. In the following description, it is understood that the output slew rate indicates either one of the up slew rate and the down slew rate, or indicates both the up slew rate and down slew rate.

A decrease in the output slew rate contributes to reduction of radiation noise, while the transceiver 10 operating as a transmission side device needs to satisfy the following output signal condition. The output signal condition may be a condition defined in the LIN standard or the CXPI standard, for example.

Figure 4:
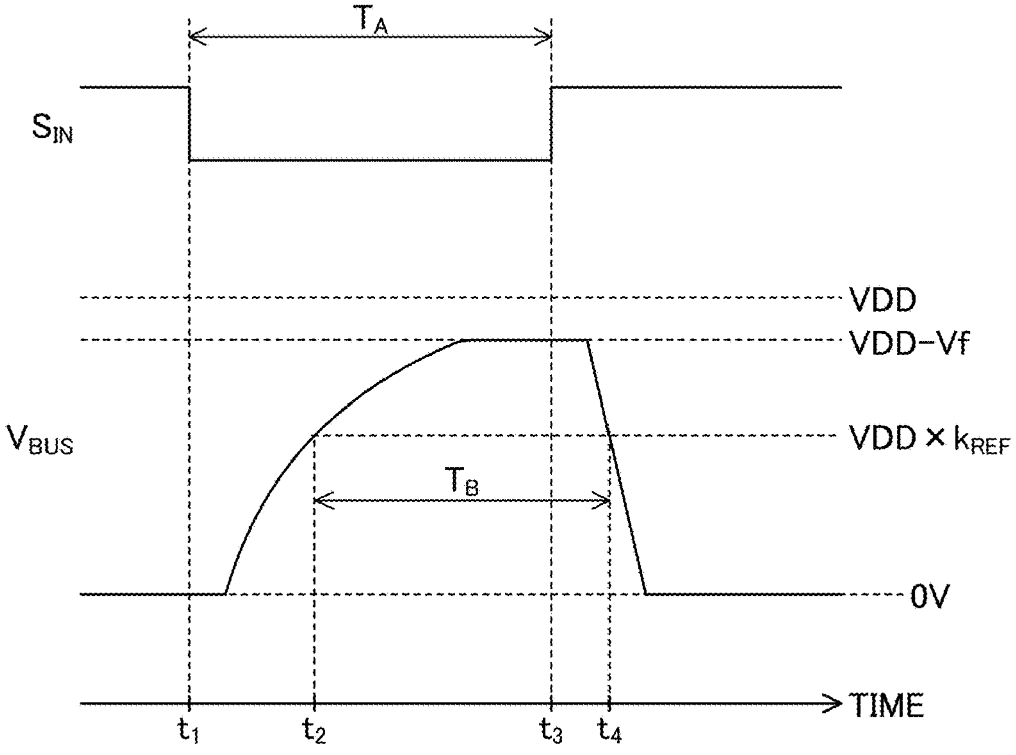
FIG. 4 is a diagram for explaining signal output conditions according to the embodiment of the present disclosure.

With reference to FIG. 4, the output signal condition to be satisfied by the transceiver 10 is described below. FIG. 4 illustrates waveforms of the control input signal $S_{IN}$ and the output voltage $V_{BUS}$. The control input signal $S_{IN}$ alternately has an output high indication level, which indicates that the output voltage $V_{BUS}$ (i.e., the output signal) has high level, and an output low indication level, which indicates that the output voltage $V_{BUS}$ (i.e., the output signal) has low level.

The charge-discharge circuit 120 charges the gate of the output transistor 111 so as to control the output transistor 111 to ON state, during the period while the control input signal $S_{IN}$ has the output low indication level, while it discharges the gate of the output transistor 111 so as to control the output transistor 111 to OFF state, during the period while the control input signal $S_{IN}$ has the output high indication level. In the example of this embodiment, the output low indication level of the control input signal $S_{IN}$ is high level, and the output high indication level of the control input signal $S_{IN}$ is low level, but it is possible to modify so that the output low indication level of the control input signal $S_{IN}$ is low level while the output high indication level thereof is high level.

A length of the low level period of the control input signal $S_{IN}$ (i.e., the period while the control input signal $S_{IN}$ has the output high indication level) is referred to as a time period $T_A$. The low level period and the high level period of the control input signal $S_{IN}$ appear alternately and repeatedly, and among the low level periods of the control input signal $S_{IN}$, a certain noted low level period has a length that is referred to as the time period $T_A$. Specifically, it is supposed that a down edge occurs in the control input signal $S_{IN}$ at a time point $t_1$, and after that an up edge occurs in the control input signal $S_{IN}$ at a time point $t_3$. In this case, the time period from the time point $t_1$ to the time point $t_3$ is the time period $T_A$. Note that a time point $t_2$ is after the time point $t_1$ and before the time point $t_3$ as illustrated in FIG. 4. A time point $t_4$ is after the time point $t_3$.

The drawing of discharge current $I_D$ from the gate of the output transistor 111 is started at the time point $t_1$. When the gate voltage $V_G$ is decreased to the gate threshold voltage $V_{G\_TH}$ by the discharge current $I_D$, the output voltage $V_{BUS}$ starts to increase from 0 V or a voltage close to 0 V, on the basis of the increase in the channel resistance value of the output transistor 111. After that, the output voltage $V_{BUS}$ reaches a voltage (VDD×$k_{REF}$) at the time point $t_2$. The voltage (VDD×$k_{REF}$) is $k_{REF}$ times the power supply voltage VDD. Here, $k_{REF}$ has a positive predetermined value less than one, which is defined by the standard applied to the communication system 1 (e.g., the LIN standard or the CXPI standard), and may have the same value as the above coefficient $k_H$. Here, "$k_{REF}=k_H=0.7$" holds. The output voltage $V_{BUS}$ increase also after the time point $t_2$.

Further, when an up edge occurs in the control input signal $S_{IN}$ at the time point $t_3$, discharging of the gate of the output transistor 111 is stopped, and instead, charging of the gate of the output transistor 111 is started. When the gate voltage $V_G$ is increased to the gate threshold voltage $V_{G\_TH}$ by the charge current $I_C$, the output voltage $V_{BUS}$ starts to decrease from a voltage higher than the voltage (VDD×$k_{REF}$), on the basis of a decrease in the channel resistance value of the output transistor 111. After that, the output voltage $V_{BUS}$ is decreased to the voltage (VDD×$k_{REF}$) at the time point $t_4$. The output voltage $V_{BUS}$ decreases also after the time point $t_4$.

The length between the time points $t_2$ and $t_4$ is referred to as a time period $T_B$. The output signal condition is a condition that a ratio of the time period $T_B$ to the time period $T_A$, i.e., a ratio ($T_B/T_A$) is a predetermined threshold value $R_{TH}$ or more. If "$T_B/T_A \geq R_{TH}$" holds, the output signal condition is satisfied. If "$T_B/T_A < R_{TH}$" holds, the output signal condition is not satisfied. The threshold value $R_{TH}$ has a positive predetermined value less than one, which is defined by the standard applied to the communication system 1 (e.g., the LIN standard or the CXPI standard), and "$R_{TH}=0.8$" holds, for example.

A forward voltage of the backcurrent prevention diode 53 is denoted by a symbol "Vf". During the low level period of the control input signal $S_{IN}$, the output voltage $V_{BUS}$ does not increase over the voltage (VDD-Vf).

Note that the signal $S_T$ also alternately has the output high indication level and the output low indication level, and the control input signal supply circuit 130 sets the level of the control input signal $S_{IN}$ to the output high indication level when receiving the signal $S_T$ of the output high indication level, while it sets the level of the control input signal $S_{IN}$ to the output low indication level when receiving the signal $S_T$ of the output low indication level. For this reason, the time period $T_A$ may be understood to correspond to the length of the period while the signal $S_T$ has the output high indication level. As described above, the control input signal $S_{IN}$ may be a binary signal obtained by shaping the waveform of the signal $S_T$ from the microcomputer 20, and the control input signal $S_{IN}$ may be a signal equivalent to the signal $S_T$. It may also be possible to understand that the signal $S_T$ itself is the control input signal $S_{IN}$.

On the other hand, in the communication system 1, the power supply voltage VDD has a voltage within a power supply voltage range from a minimum voltage $VDD_{MIN}$ to a maximum voltage $VDD_{MAX}$. The minimum voltage $VDD_{MIN}$ and the maximum voltage $VDD_{MAX}$ have positive predetermined voltage values that satisfy "$0<VDD_{MIN}<VDD_{MAX}$". It is always necessary to satisfy the output signal condition as long as the power supply voltage VDD is within the power supply voltage range. If the output slew rate is set to be always sufficiently large, the output signal condition is easily satisfied, but an increase in the output slew rate causes an increase in radiation noise.

[Radiation Noise Condition]

The transceiver 10 is also required to satisfy a radiation noise condition conforming the standard applied to the communication system 1 (e.g., the LIN standard or the CXPI standard). If the amount of radiation noise from the communication system 1 when the transceiver 10 is operated as a transmission side device is a specified value or less in a predetermined noise test environment, the radiation noise condition for the transceiver 10 is satisfied. Usually, a radiation noise test is performed, in which the amount of radiation noise from the communication system 1 when the transceiver 10 is operated as a transmission side device is measured, in a predetermined noise test environment, and it is determined whether or not the radiation noise condition is satisfied on the basis of the measured value. Here, the power supply voltage VDD in the noise test environment is a test voltage $VDD_{TYP}$ having a typical value within the power supply voltage range. The test voltage $VDD_{TYP}$ is higher than the minimum voltage $VDD_{MIN}$ and is lower than the maximum voltage $VDD_{MAX}$. For instance, $VDD_{TYP}=(VDD_{MIN}+VDD_{MAX})/2$ may hold.

[Reference Method]

Figure 5:
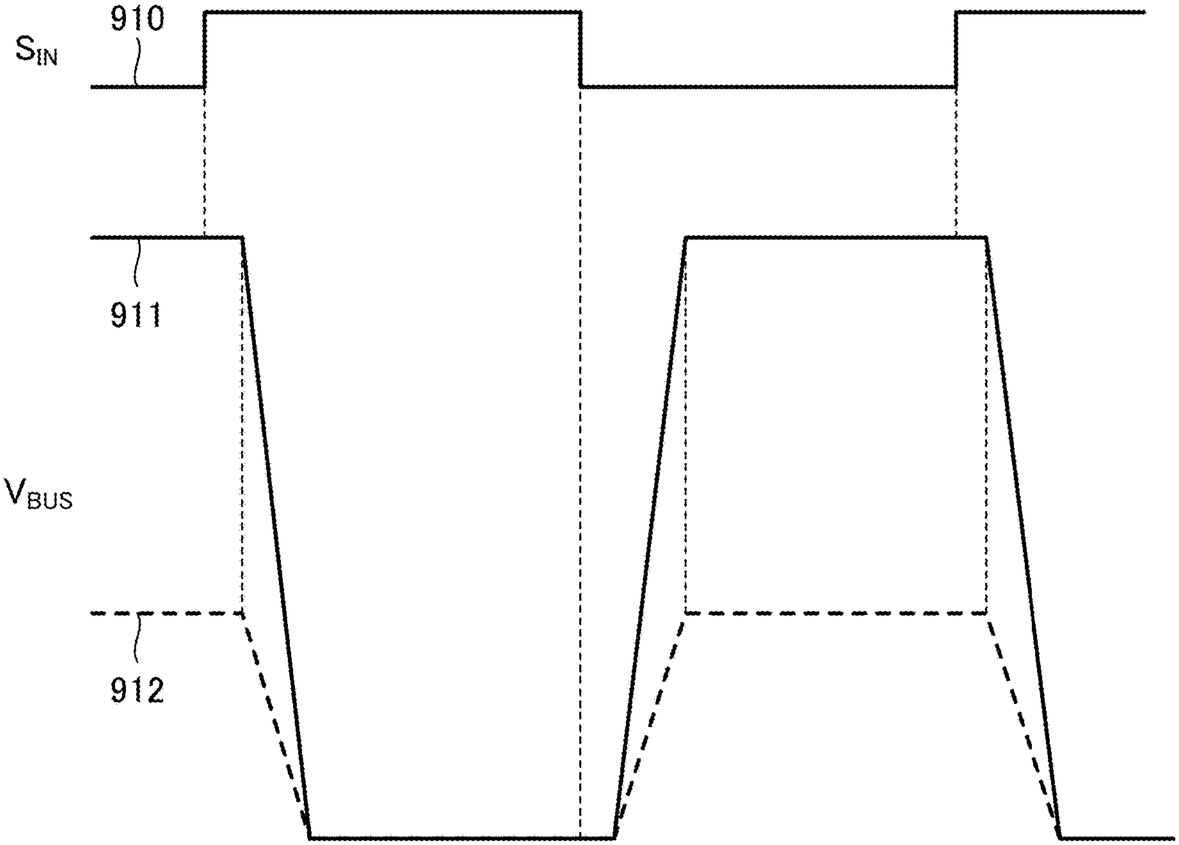
FIG. 5 is a diagram schematically illustrating waveforms of a control input signal and an output voltage according to a reference method.

As a method for aiming to satisfy both the output signal condition and the radiation noise condition, a method is studied that allows the output slew rate to be proportional to the power supply voltage VDD (a reference method). FIG. 5 schematically illustrates the waveforms of the control input signal $S_{IN}$ and the output voltage $V_{BUS}$ when the reference method is adopted. In FIG. 5, a rectangular waveform 910 is a waveform of the control input signal $S_{IN}$, a solid polygonal line waveform 911 is a waveform of the output voltage $V_{BUS}$ when "$VDD=VDD_{MAX}$" holds, and a broken polygonal line waveform 912 is a waveform of the output voltage $V_{BUS}$ when "$VDD=VDD_{MIN}$" holds. Note that the waveforms 911 and 912 are partially overlapped.

Figure 6:
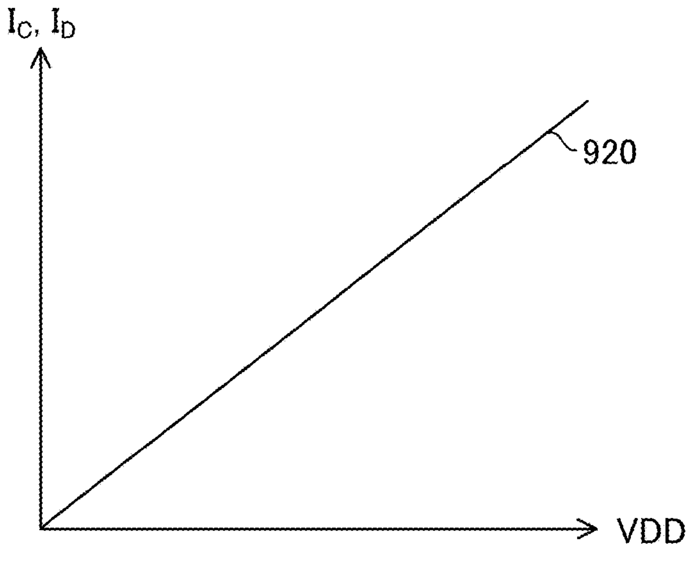
FIG. 6 is a relationship diagram between a power supply voltage and a charge current or a discharge current according to the reference method.
Figure 7:
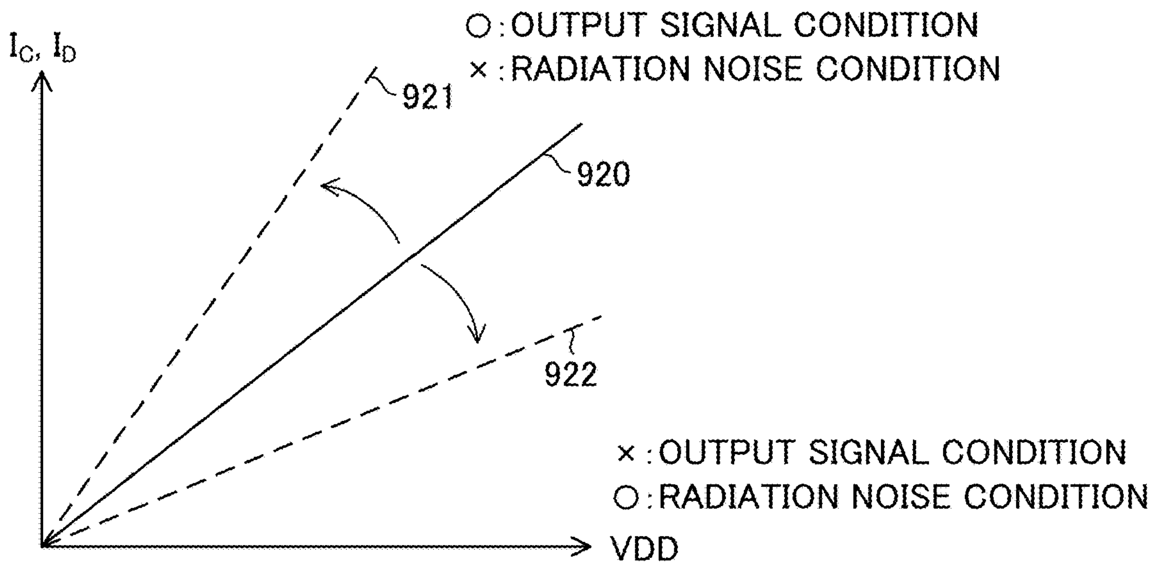
FIG. 7 is a diagram illustrating easiness of satisfying an output signal condition and a radiation noise condition, in the relationship between the power supply voltage and the charge current or the discharge current, according to the reference method.

In the reference method, the charge current $I_C$ and the discharge current $I_D$ are allowed to be proportional to the power supply voltage VDD as illustrated in FIG. 6, and thus the output slew rate is allowed to be proportional to the power supply voltage VDD. In FIG. 6, a solid line 920 indicates a relationship between the power supply voltage VDD and the charge current $I_C$ or the discharge current $I_D$, according to the reference method. The output slew rate and the radiation noise have a trade-off relationship. In other words, in the reference method, if a proportionality constant is increased when the values of the charge current $I_C$ and the discharge current $I_D$ are allowed to be proportional to the power supply voltage VDD, like changing from the solid line 920 to a broken line 921 in FIG. 7, the output signal condition can be easily satisfied along with the increase in the output slew rate, while the radiation noise condition can be hardly satisfied. In the reference method, if the proportionality constant is decreased when the values of the charge current $I_C$ and the discharge current $I_D$ are allowed to be proportional to the power supply voltage VDD, like changing from the solid line 920 to a broken line 922 in FIG. 7, the radiation noise condition can be easily satisfied along with the decrease in the output slew rate, while the output signal condition can be hardly satisfied.

[Satisfaction of Both Output Signal Condition and Radiation Noise Condition]

Here, it is basically harder to satisfy the output signal condition as the power supply voltage VDD is lower. In order to satisfy the output signal condition, it is necessary to increase the ratio ($T_B/T_A$), and it is because the ratio ($T_B/T_A$) tends to be smaller as a ratio of a forward voltage Vf (a forward voltage Vf of the backcurrent prevention diode 53) in the power supply voltage VDD is larger.

Figure 8:
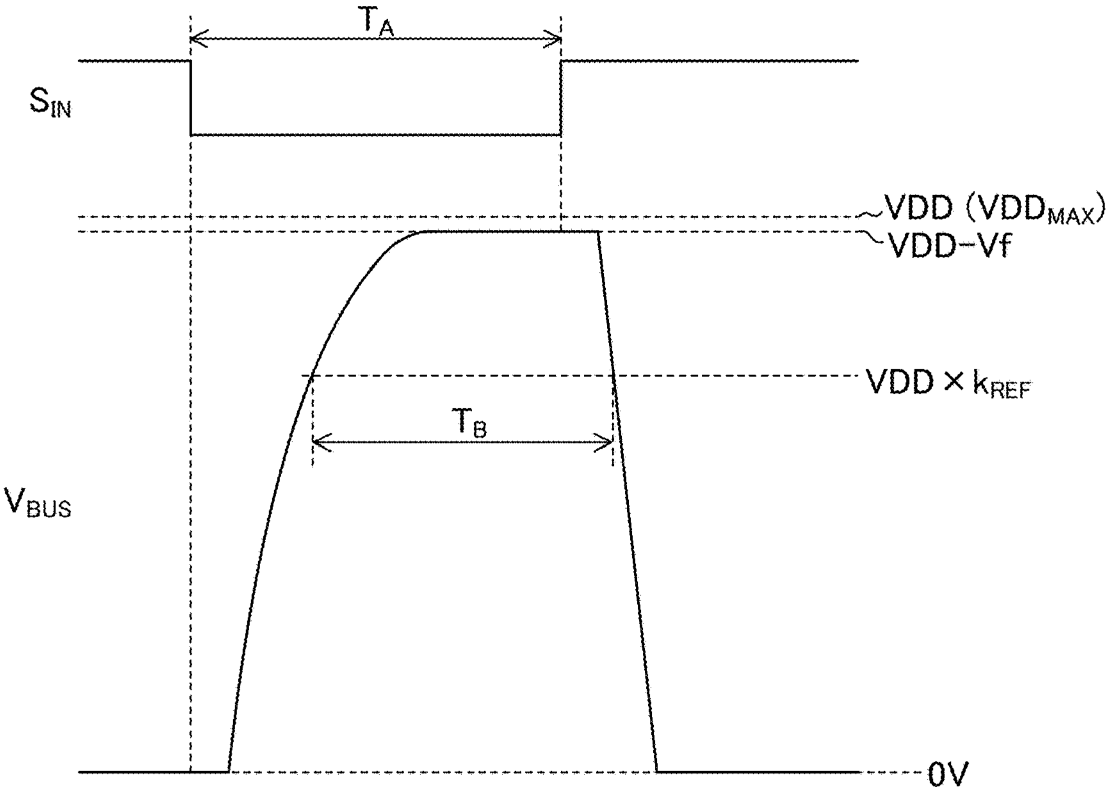
FIG. 8 is a diagram schematically illustrating waveforms of the control input signal and the output voltage when the power supply voltage is relatively high.
Figure 9:
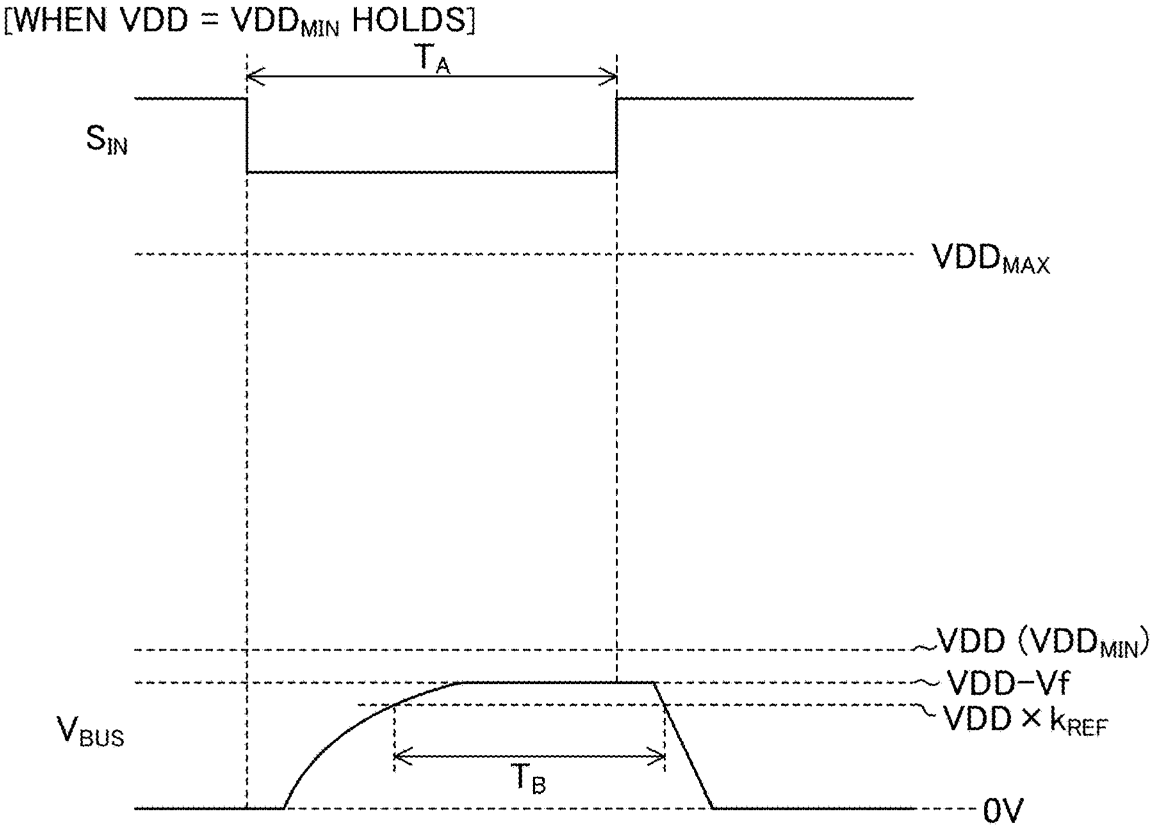
FIG. 9 is a diagram schematically illustrating waveforms of the control input signal and the output voltage when the power supply voltage is relatively low.

FIG. 8 schematically illustrates the waveforms of the control input signal $S_{IN}$ and the output voltage $V_{BUS}$ when "VDD=$VDD_{MAX}$" holds. FIG. 9 schematically illustrates the waveforms of the control input signal $S_{IN}$ and the output voltage $V_{BUS}$ when "VDD=$VDD_{MIN}$" holds. An additional description is given as follows with reference to a specific value example. As described above, it is supposed that "$k_{REF}$=0.7" holds. Further it is supposed that ($VDD_{MAX}$, $VDD_{MIN}$, Vf)=(27 V, 5 V, 0.7 V) holds.

In the case where "VDD=$VDD_{MAX}$" holds, "($VDD_{MAX}$−Vf)=26.3 V", "VDD×$k_{REF}$=$VDD_{MAX}$×0.7=18.9 V", and "18.9/26.3≈0.719" hold. Therefore, in the case where "VDD=$VDD_{MAX}$" holds, in order that the output voltage $V_{BUS}$ might reach the voltage (VDD×$k_{REF}$) after the down edge of the control input signal $S_{IN}$, it is necessary that the output voltage $V_{BUS}$ be increased from 0 V by approximately 0.719 times the voltage (VDD-Vf). In the case where "VDD=$VDD_{MIN}$" holds, "($VDD_{MIN}$-Vf)=4.3 V", "VDD×$k_{REF}$=$VDD_{MIN}$×0.7=3.5 V" and "3.5/4.3≈0.814" hold. Therefore, in the case where "VDD=$VDD_{MIN}$" holds, in order that the output voltage $V_{BUS}$ might reach the voltage (VDD×$k_{REF}$) after the down edge of the control input signal $S_{IN}$, it is necessary that the output voltage $V_{BUS}$ be increased from 0 V by approximately 0.814 times the voltage (VDD-Vf).

In the reference method, the time necessary for the output voltage $V_{BUS}$ to increase by approximately 0.814 times the voltage (VDD-Vf) is longer than the time necessary for the output voltage $V_{BUS}$ to increase by approximately 0.719 times the voltage (VDD-Vf). As a result, in the reference method, the output signal condition is hardly satisfied when the power supply voltage VDD is identical or similar to the minimum voltage $VDD_{MIN}$ (on the contrary, if the output slew rate is increased so as to satisfy the output signal condition, the radiation noise condition is hardly satisfied).

[Improved Method]

Figure 10:
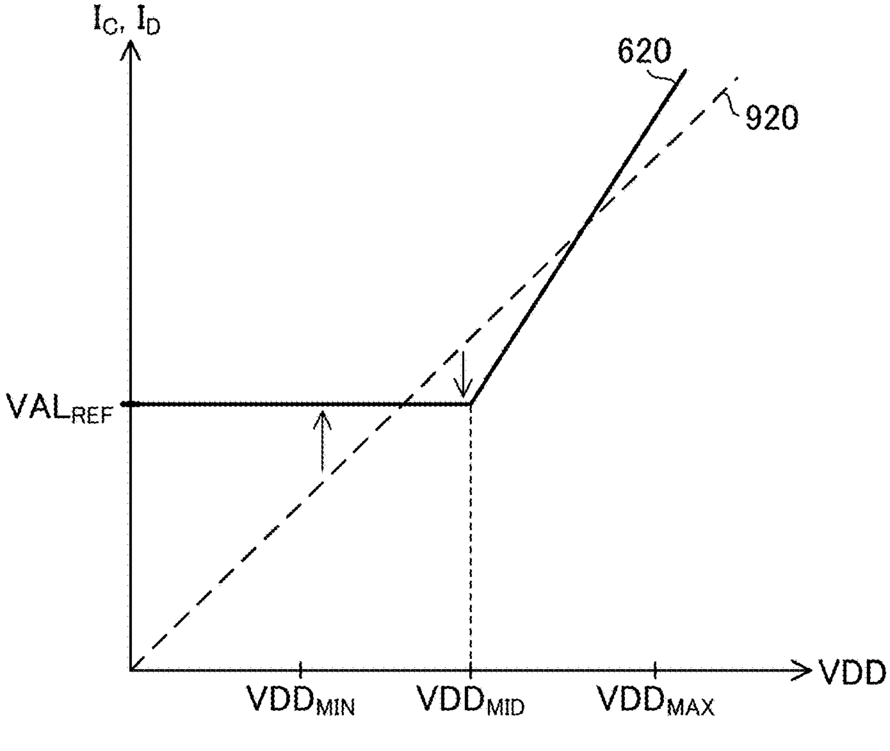
FIG. 10 is a relationship diagram between the power supply voltage and the charge current or the discharge current, according to the embodiment of the present disclosure.

Therefore, the transceiver 10 according to this embodiment adopts an improved method different from the reference method. In the transceiver 10 according to the improved method, the charge current $I_C$ and the discharge current $I_D$ are changed nonlinearly in accordance with the power supply voltage VDD. FIG. 10 is referred. In FIG. 10, a solid polygonal line 620 indicates a relationship between the power supply voltage VDD and an adjustment target current in the improved method, i.e., a relationship between the power supply voltage VDD and the adjustment target current in the transceiver 10. The adjustment target current indicates a current whose current value is adjusted in accordance with the power supply voltage VDD, and the charge-discharge circuit 120 changes the adjustment target current (the value of the adjustment target current) nonlinearly in accordance with the power supply voltage VDD. The charge current $I_C$ in the high level period of the control input signal $S_{IN}$ and the discharge current $I_D$ in the low level period of the control input signal $S_{IN}$ each correspond to the adjustment target current. The broken line 920 in FIG. 10 indicates the same one as the corresponding solid line 920 in FIG. 6.

A voltage $VDD_{MID}$ illustrated in FIG. 10 is a predetermined boundary voltage, which is higher than the minimum voltage $VDD_{MIN}$ and is lower than the maximum voltage $VDD_{MAX}$. The charging current source 121*a* is configured as a variable current source having a variable value of the charge current $I_C$, and the discharging current source 122*a* is configured as a variable current source having a variable value of the discharge current $I_D$. The charge-discharge circuit 120 sets a value of the charge current $I_C$ and a value of the discharge current $I_D$, i.e., the value of the adjustment target current, in accordance with the power supply voltage VDD.

Specifically, if the power supply voltage VDD is the boundary voltage $VDD_{MID}$ or less, the charge-discharge circuit 120 sets and maintains the value of the adjustment target current (the value of the charge current $I_C$ and the value of the discharge current $I_D$) to a predetermined reference current value $VAL_{REF}$. If the power supply voltage VDD is higher than the boundary voltage $VDD_{MID}$, the charge-discharge circuit 120 increases the value of the adjustment target current (the value of the charge current $I_C$ and the value of the discharge current $I_D$) to be larger than the reference current value $VAL_{REF}$, and increases the he value of the adjustment target current along with an increase in the power supply voltage VDD.

For instance, the value of the adjustment target current when "VDD>$VDD_{MID}$" holds is denoted by a symbol "VAL", and then "VAL=$k_p$×(VDD-$VDD_{MID}$)+$VAL_{REF}$" may hold. Here, $k_p$ is a coefficient having a predetermined positive value. In this way, in the improved method, there is a nonlinear relationship between the power supply voltage VDD and the adjustment target current.

Note that the reference current value $VAL_{REF}$ for the charge current $I_C$ may be the same as the reference current value $VAL_{REF}$ for the discharge current $I_D$, or they may be different from each other. The boundary voltage $VDD_{MID}$ may be the same as the test voltage $VDD_{TYP}$ described above. Alternatively, the boundary voltage $VDD_{MID}$ may be higher than the test voltage $VDD_{TYP}$ though it is close to the test voltage $VDD_{TYP}$.

According to the improved method, in the environment where "VDD=$VDD_{MIN}$" holds, the value of the adjustment target current can be larger than that in the reference method (920), and in the noise test environment the value of the adjustment target current can be smaller than that in the reference method (920). For this reason, it is possible to satisfy both the output signal condition and the radiation noise condition (both a required performance related to the output slew rate and a required performance related to the radiation noise). If "$VDD>VDD_{MID}$" holds, the adjustment target current should be increased in accordance with an increase in the power supply voltage VDD, so that the output signal condition can be satisfied also in the case where "$VDD>VDD_{MID}$" holds.

Figure 11:
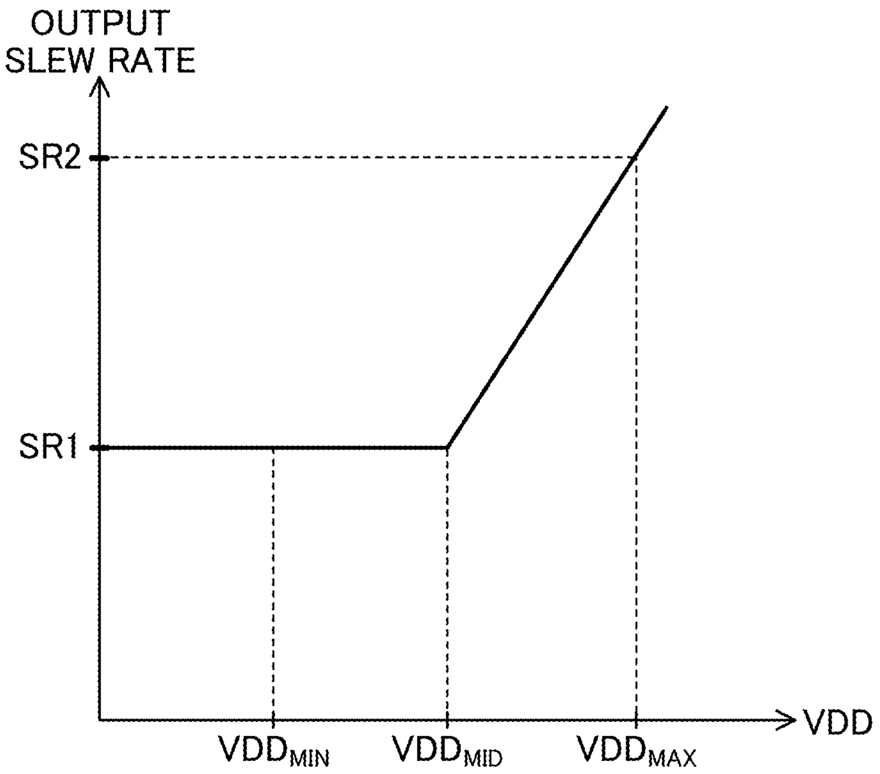
FIG. 11 is a relationship diagram between the power supply voltage and an output slew rate according to the embodiment of the present disclosure.

The output slew rate is schematically proportional to the adjustment target current, and hence a relationship between the power supply voltage VDD and the output slew rate in the improved method is like the relationship illustrated in FIG. 11. In FIG. 11, SR1 represents the output slew rate when "$VDD=VDD_{MIN}$" holds, and SR2 represents the output slew rate when "$VDD=VDD_{MAX}$" holds.

Now, values J1 and J2 are defined as follows. The value J1 is a value obtained by dividing the output slew rate SR1 by the minimum voltage $VDD_{MIN}$ (i.e., $J1=SR1/VDD_{MIN}$). The value J2 is a value obtained by dividing the output slew rate SR2 by the maximum voltage $VDD_{MAX}$ (i.e., $J2=SR2/VDD_{MAX}$). The charge-discharge circuit 120 according to the improved method changes the adjustment target current in accordance with the power supply voltage VDD, so that the value J1 is higher than the value J2. "J1>J2" is an inequality expressing a part of the characteristics illustrated in FIGS. 10 and 11.

If "$VDD_{MIN} \leq VDD \leq VDD_{MID}$" holds in the characteristics illustrated in FIG. 10, the output slew rate is maintained at the output slew rate SR1. For this reason, a value J3 obtained by dividing the output slew rate SR1 by the boundary voltage $VDD_{MID}$ (i.e., $J3=SR1/VDD_{MID}$) is smaller than the value J1. "J1>J3" is an inequality expressing a part of the characteristics illustrated in FIGS. 10 and 11.

EXAMPLE

Figure 12:
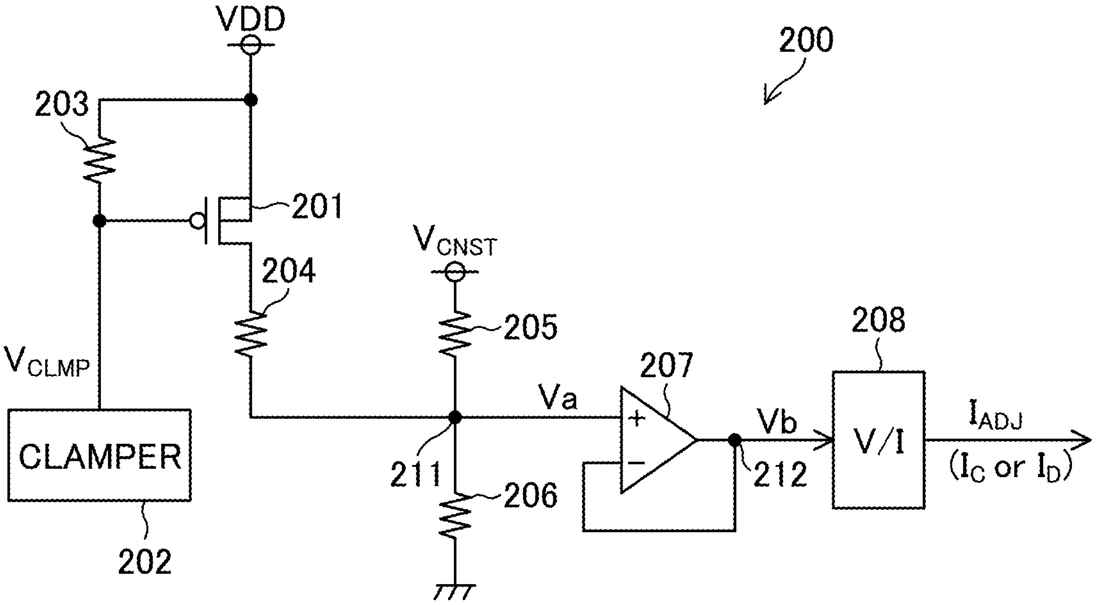
FIG. 12 is a structural diagram of a current generation circuit according to the embodiment of the present disclosure.

FIG. 12 illustrates a current generation circuit 200 as an example of a circuit that generates the adjustment target current. The current generation circuit 200 can be disposed in the charge-discharge circuit 120. The adjustment target current generated by the current generation circuit 200 is denoted by a symbol "$I_{ADJ}$". The adjustment target current $I_{ADJ}$ is the charge current $I_C$ or the discharge current $I_D$.

The current generation circuit 200 includes a transistor 201 as a P-channel type MOSFET, a clamper 202 that generates and outputs a clamp voltage $V_{CLMP}$, resistors 203 to 206, an operational amplifier 207, and a V/I conversion circuit 208.

The power supply voltage VDD is applied to the source of the transistor 201 and one end of the resistor 203. The gate of the transistor 201 and the other end of the resistor 203 are connected to each other and receive the clamp voltage $V_{CLMP}$ supplied from the clamper 202. The clamp voltage $V_{CLMP}$ has a predetermined positive DC voltage value. The boundary voltage $VDD_{MID}$ described above is determined depending on the clamp voltage $V_{CLMP}$. The drain of the transistor 201 is connected to a node 211 via the resistor 204. A positive constant voltage $V_{CNST}$ is applied to one end of the resistor 205, and the other end of the resistor 205 is connected to the node 211. One end of the resistor 206 is connected to the node 211, and the other end of the resistor 206 is connected to the ground. A voltage applied to the node 211 is referred to as a voltage Va.

The operational amplifier 207 constitutes an impedance conversion circuit that outputs the voltage Va of the node 211 to a node 212 with a low impedance. A voltage applied to the node 212 is referred to as a voltage Vb. The operational amplifier 207 works as a voltage follower, and the voltage Vb is equal to the voltage Va (if error is omitted). Specifically, the non-inverting input terminal of the operational amplifier 207 is connected to the node 211, while the inverting input terminal and the output terminal of the operational amplifier 207 are connected to the node 212. The V/I conversion circuit 208 is connected to the node 212, so as to convert the voltage Vb into the adjustment target current $I_{ADJ}$. The V/I conversion circuit 208 allows the adjustment target current $I_{ADJ}$ to have a current value proportional to the value of the voltage Vb.

An operation of the current generation circuit 200 depending on the power supply voltage VDD is described below. When "$VDD<VDD_{MID}$" holds, a voltage for turning on the transistor 201 is not applied to between gate and source of the transistor 201, and the transistor 201 is maintained in OFF state. Therefore, when "$VDD<VDD_{MID}$" holds, the voltages Va and Vb have a constant voltage value determined by only a resistance value ratio between the resistors 205 and 206 and the constant voltage $V_{CNST}$, and as a result, the adjustment target current $I_{ADJ}$ has the reference current value $VAL_{REF}$ (see FIG. 10), which is a constant current value corresponding to the constant voltage value. It may be understood that the case where "$VDD=VDD_{MID}$" holds is the same as the case where "$VDD<VDD_{MID}$" holds.

When "$VDD>VDD_{MID}$" holds, the source potential of the transistor 201 with respect to the gate potential of the transistor 201 is more than or equal to the gate threshold voltage of the transistor 201, and the transistor 201 becomes ON state. When "$VDD>VDD_{MID}$" holds, a current corresponding to the power supply voltage VDD flows from the application terminal of the power supply voltage VDD into the node 211 via the transistor 201 and the resistor 204, and the voltages Va and Vb are increased by the current through the transistor 201. Therefore, when "$VDD>VDD_{MID}$" holds, the value of the adjustment target current $I_{ADJ}$ becomes larger than the reference current value $VAL_{REF}$, and it increases along with an increase in the power supply voltage VDD.

It is possible to separately dispose the current generation circuit 200, which generates the charge current $I_C$ as the adjustment target current $I_{ADJ}$, and the current generation circuit 200, which generates the discharge current $I_D$ as the adjustment target current $I_{ADJ}$, in the charge-discharge circuit 120. Alternatively, it is possible to dispose two V/I conversion circuits 208 in the single current generation circuit 200. In this case, the first V/I conversion circuit 208 is connected to the node 212, so as to convert the voltage Vb at the node 212 into the charge current $I_C$, while the second V/I conversion circuit 208 is connected to the node 212, so as to convert the voltage Vb at the node 212 into the discharge current $I_D$.

[Supplement]

Supplementary note, applied technology, modified technology, or the like of the above embodiment is described below.

The communication system 1 can be mounted in a vehicle such as an automobile. In a vehicle such as an automobile, the communication system 1 can be used as a system that performs bidirectional communication conforming the LIN standard or the CXPI standard. More specifically, for example, the communication between the transceiver 10 and the other side device 30 can be used for signal communication to realize body control of a power window, a mirror, an electric seat, a door lock, or the like mounted in an automobile.

However, the communication system 1 is not limited to the automotive application. The communication system 1 can be applied to any use in which relatively low speed communication is performed.

The transceiver 10 includes the signal transmitting apparatus, which generates an output signal corresponding to an input signal at the bus connection terminal BUS that works as an output terminal (in other words, which transmits the same from the bus connection terminal BUS). Components of the signal transmitting apparatus includes the transmitting circuit TX, and further can include the bus connection terminal BUS. It is possible to understand that the input signal for the signal transmitting apparatus is the control input signal $S_{IN}$. Because the control input signal $S_{IN}$ is a signal based on the signal $S_T$ from the microcomputer 20, the input signal for the signal transmitting apparatus may be understood to be the signal $S_T$. It is possible to form a semiconductor device that includes functions of the transceiver 10 and the microcomputer 20, and in this case the signal transmitting apparatus is disposed in the semiconductor device.

For an arbitrary signal or voltage, a relationship between high level and low level may be opposite to that described above, without impairing the spirit of the above description.

The type of the channel of the field effect transistor (FET) described in each embodiment is merely an example. Without impairing the spirit of the above description, the type of the channel of an arbitrary FET can be changed between P-channel and N-channel types.

As long as no inconvenience occurs, the arbitrary transistor described above may be any type of transistor. For instance, an arbitrary transistor described above as an MOSFET may be replaced by a junction type FET, an insulated gate bipolar transistor (IGBT), or a bipolar transistor, as long as no inconvenience occurs. An arbitrary transistor has a first electrode, a second electrode and a control electrode. In an FET, one of the first and second electrodes is the drain while the other is the source, and the control electrode is the gate. In an IGBT, one of the first and second electrodes is the collector while the other is the emitter, and the control electrode is the gate. In a bipolar transistor that is not classified into IGBT, one of the first and second electrodes is the collector while the other is the emitter, and the control electrode is the base.

The embodiment of the present disclosure can be appropriately modified variously within the scope of the technical concept recited in the claims. The above embodiment is merely an example of the embodiment of the present disclosure, and meaning of terms of the present disclosure and the structural elements are not limited to those described in the above embodiment. Specific numerical values in the above description are merely examples and can be changed to various values as a matter of course.

<<Additional Remarks>>

Additional remarks are described below for the present disclosure in which the specific structural examples are shown with reference to the above embodiment.

A signal transmitting apparatus (10) according to one aspect of the present disclosure includes: an output terminal (BUS) configured to be connected to an application terminal (50) of a power supply voltage (VDD) via a pull-up resister (52) and a backcurrent prevention diode (53); an output transistor (111) disposed between the output terminal and a ground; a capacitor (112) connected between the gate of the output transistor and the output terminal; and a charge-discharge circuit (120) configured to charge or discharge the gate of the output transistor in accordance with an input signal ($S_{IN}$). The charge or discharge of the gate of the output transistor causes the output transistor to be turned on or off, so that an output signal ($V_{BUS}$) corresponding to the input signal is generated at the output terminal, the backcurrent prevention diode has a forward direction from the application terminal of the power supply voltage to the output terminal, and the charge-discharge circuit sets a charge current ($I_C$) and a discharge current ($I_D$) of the gate of the output transistor as an adjustment target current, and changes the adjustment target current nonlinearly in accordance with the power supply voltage (first structure).

Thus, it becomes easy to satisfy both a required performance related to an output slew rate and a required performance related to radiation noise.

The signal transmitting apparatus according to the above first structure may have a structure (second structure), in which, compared with a case where the power supply voltage has a predetermined first voltage value (e.g., $VDD_{MIN}$ or $VDD_{MID}$), in a case where the power supply voltage has a predetermined second voltage value (e.g., $VDD_{MAX}$) larger than the first voltage value, the charge-discharge circuit sets the adjustment target current to be larger and allows a nonlinear relationship between the power supply voltage and the adjustment target current.

The signal transmitting apparatus having the above first structure may have a structure (third structure), in which the charge-discharge circuit maintains a value of the adjustment target current at a predetermined reference current value ($VAL_{REF}$) when the power supply voltage is a predetermined boundary voltage ($VDD_{MID}$) or less, while the charge-discharge circuit sets the value of the adjustment target current larger than the reference current value, and increases the same along with an increase in the power supply voltage, when the power supply voltage is higher than the boundary voltage.

The signal transmitting apparatus having any one of the above first to third structures may have a structure (fourth structure), in which the power supply voltage is within a voltage range from a predetermined minimum voltage ($VDD_{MIN}$) to a predetermined maximum voltage ($VDD_{MAX}$), the charge-discharge circuit changes the adjustment target current in accordance with the power supply voltage, so that a first value (J1) is larger than a second value (J2), the first value is a value obtained by dividing a slew rate of the output signal when the power supply voltage is equal to the minimum voltage by the minimum voltage, and the second value is a value obtained by dividing the slew rate of the output signal when the power supply voltage is equal to the maximum voltage by the maximum voltage.

The signal transmitting apparatus having any one of the above first to fourth structures may have a structure (fifth structure), in which the charge-discharge circuit charges the gate of the output transistor so as to turn on the output transistor when the input signal has a first level (e.g., high level), while the charge-discharge circuit discharges the gate of the output transistor so as to turn off the output transistor when the input signal has a second level (e.g., low level), and the charge-discharge circuit includes a charging circuit (121) configured to supply the charge current to the gate of the output transistor during a period while the input signal has the first level, and a discharging circuit (122) configured to draw the discharge current from the gate of the output transistor during a period while the input signal has the second level.

The signal transmitting apparatus having any one of the above first to fifth structures may have a structure (sixth structure), in which the drain of the output transistor is connected to the output terminal via another backcurrent prevention diode (113) having a forward direction from the output terminal to the ground, or the drain of the output transistor is directly connected to the output terminal.

The invention claimed is:

1. A signal transmitting apparatus comprising:

an output terminal configured to be connected to an application terminal of a power supply voltage via a pull-up resister and a backcurrent prevention diode;

an output transistor disposed between the output terminal and a ground;

a capacitor connected between the gate of the output transistor and the output terminal; and a charge-discharge circuit configured to charge or discharge the gate of the output transistor in accordance with an input signal, wherein the charge or discharge of the gate of the output transistor causes the output transistor to be turned on or off, so that an output signal corresponding to the input signal is generated at the output terminal, the backcurrent prevention diode has a forward direction from the application terminal of the power supply voltage to the output terminal, and the charge-discharge circuit sets a charge current and a discharge current of the gate of the output transistor as an adjustment target current, and changes the adjustment target current nonlinearly in accordance with the power supply voltage.

2. The signal transmitting apparatus according to claim 1, wherein compared with a case where the power supply voltage has a predetermined first voltage value, in a case where the power supply voltage has a predetermined second voltage value larger than the first voltage value, the charge-discharge circuit sets the adjustment target current to be larger and allows a nonlinear relationship between the power supply voltage and the adjustment target current.

3. The signal transmitting apparatus according to claim 1, wherein the charge-discharge circuit maintains a value of the adjustment target current at a predetermined reference current value when the power supply voltage is a predetermined boundary voltage or less, while the charge-discharge circuit sets the value of the adjustment target current larger than the reference current value, and increases the same along with an increase in the power supply voltage, when the power supply voltage is higher than the boundary voltage.

4. The signal transmitting apparatus according to claim 1, wherein the power supply voltage is within a voltage range from a predetermined minimum voltage to a predetermined maximum voltage, the charge-discharge circuit changes the adjustment target current in accordance with the power supply voltage, so that a first value is larger than a second value, the first value is a value obtained by dividing a slew rate of the output signal when the power supply voltage is equal to the minimum voltage by the minimum voltage, and the second value is a value obtained by dividing the slew rate of the output signal when the power supply voltage is equal to the maximum voltage by the maximum voltage.

5. The signal transmitting apparatus according to claim 1, wherein the charge-discharge circuit charges the gate of the output transistor so as to turn on the output transistor when the input signal has a first level, while the charge-discharge circuit discharges the gate of the output transistor so as to turn off the output transistor when the input signal has a second level, and the charge-discharge circuit includes a charging circuit configured to supply the charge current to the gate of the output transistor during a period while the input signal has the first level, and a discharging circuit configured to draw the discharge current from the gate of the output transistor during a period while the input signal has the second level.

6. The signal transmitting apparatus according to claim 1, wherein the drain of the output transistor is connected to the output terminal via another backcurrent prevention diode having a forward direction from the output terminal to the ground, or the drain of the output transistor is directly connected to the output terminal.

* * * * *